US009640495B2

(12) United States Patent
Olson et al.

(10) Patent No.: US 9,640,495 B2
(45) Date of Patent: May 2, 2017

(54) SEMICONDUCTOR DEVICE PROCESSING METHOD FOR MATERIAL REMOVAL

(71) Applicant: DECA Technologies Inc., Tempe, AZ (US)

(72) Inventors: Timothy L. Olson, Phoenix, AZ (US); William Boyd Rogers, Raleigh, NC (US); Ferdinand Aldas, San Pedro (PH)

(73) Assignee: Deca Technologies Inc., Tempe, AZ (US)

( * ) Notice: Subject to any disclaimer, the term of this patent is extended or adjusted under 35 U.S.C. 154(b) by 0 days.

(21) Appl. No.: 15/204,871

(22) Filed: Jul. 7, 2016

(65) Prior Publication Data

US 2017/0012009 A1    Jan. 12, 2017

Related U.S. Application Data

(60) Provisional application No. 62/189,952, filed on Jul. 8, 2015.

(51) Int. Cl.
*H01L 21/302* (2006.01)
*H01L 21/461* (2006.01)
*H01L 23/00* (2006.01)

(52) U.S. Cl.
CPC ............ *H01L 24/03* (2013.01); *H01L 24/05* (2013.01); *H01L 24/75* (2013.01); *H01L 2224/0345* (2013.01); *H01L 2224/0381* (2013.01); *H01L 2224/0391* (2013.01); *H01L 2224/03452* (2013.01); *H01L 2224/03462* (2013.01);

(Continued)

(58) Field of Classification Search
CPC ............. H01L 21/288; H01L 21/32134; H01L 21/02019; H01L 23/49827; H01L 2224/7501; H01L 2224/75651; H01L 2224/742; H01L 24/02; H01L 24/75; H01L 21/31116; H01L 29/41733; H01L 21/302; H01L 21/461
See application file for complete search history.

(56) References Cited

U.S. PATENT DOCUMENTS 6,271,149 B1 * 8/2001 Kondo ............... H01L 31/18
430/127

FOREIGN PATENT DOCUMENTS

CN    103021811    4/2013
JP    2004296563    10/2004
(Continued)

*Primary Examiner* — Jasmine Clark
(74) *Attorney, Agent, or Firm* — Booth Udall Fuller, PLC

(57) ABSTRACT

A method of removing at least a portion of a layer of material from over a semiconductor substrate that can include dispensing an etching solution over the semiconductor substrate to form a pool of etching solution on the layer of material, wherein a footprint of the pool of etching solution is less than a footprint of the semiconductor substrate. The pool of etching solution and the semiconductor substrate can be moved with respect to each other. A pool boundary of the pool of etching solution can be defined on the semiconductor substrate with at least one air-knife such that the pool of etching solution etches the layer of material over the semiconductor substrate within the footprint of the pool of etching solution. The etching solution and at least a portion of the layer of material etched by the etching solution can be removed with the at least one air-knife.

20 Claims, 8 Drawing Sheets

(52) U.S. Cl.
CPC ............ *H01L 2224/03464* (2013.01); *H01L 2224/03614* (2013.01); *H01L 2224/0401* (2013.01); *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/742* (2013.01); *H01L 2224/7501* (2013.01); *H01L 2224/75651* (2013.01)

(56) References Cited

FOREIGN PATENT DOCUMENTS

| | | |
|---|---|---|
| JP | 2009213958 | 9/2009 |
| JP | 2009279477 | 12/2009 |
| WO | 2012020274 | 2/2012 |

* cited by examiner

SEMICONDUCTOR DEVICE PROCESSING METHOD FOR MATERIAL REMOVAL

RELATED APPLICATIONS

This application claims the benefit of U.S. Provisional Application No. 62/189,952, filed Jul. 8, 2016, the entirety of the disclosure of which is hereby incorporated by this reference.

TECHNICAL FIELD

The disclosure relates in general to a semiconductor device and method for removing material from a substrate, such as removal of undesired portions of a conductive seed layer or photoresist material from a substrate or semiconductor substrate, such as a native semiconductor wafer, a reconstituted semiconductor wafer, a panel, a fan-out wafer or panel, an embedded die panel, a chip carrier substrate, a printed circuit board (PCB), a printed wiring panel, or derivatives thereof. The method for removing material from a substrate can also be applicable to other processes such as the manufacture of liquid crystal displays (LCDs) for TV panels, or other similar applications, and is not limited to wafer level processing.

BACKGROUND

Semiconductor devices are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, front-end manufacturing, and back-end manufacturing, each involving potentially hundreds of steps. Front-end manufacturing involves the formation of a plurality of semiconductor die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Back-end processing of semiconductor die includes a number of surface mount technologies (SMT) that are used to connect semiconductor die or integrated circuits to surfaces of substrates and PCBs without the use of through holes in the PCBs. Quad Flat Packages (QFP) use SMT that includes leads that extend from each of the four sides of the package, sometimes referred to as "gull wing leads." QFP leads provide electrical Input/Output (I/O) interconnection between the semiconductor die within the package and the PCB or substrate to which the QFP is mounted. Other SMT packages are made without leads and are commonly referred to flat no lead packages. Examples of flat no lead packages are Quad-flat no leads packages (QFNs) and dual-flat no lead (DFN) packages. QFN packages conventionally include a semiconductor die connected by wirebonds to a leadframe that is used for package I/O interconnection.

Both front-end manufacturing and back-end manufacturing can include processes or steps in which material is removed from a semiconductor device or semiconductor substrate, such as removal of undesired portions of a conductive layer, such as a seed layer or, removal of another undesired material, such as all or part of a photosensitive or photoresist material. Conventionally, removal of undesired material has been achieved with laser ablation or etching. Etching of undesired material has been conventionally performed in a bath or by spinning in a bowl.

Application of the etching solution to the material to be removed has conventionally been achieved by immersing the material to be removed, together with the wafer or panel on which the material has been formed, into a bath of the etching solution contained within a large tub or vat. The etching solution in the bath is conventionally contained within the bath, so as to prevent leakage and waste of the etching solution and, in the case of some submersion systems, inclusion of rolling seals where the wafer or panel enters and exits the bath can also be included. The rolling seals apply pressure to the panel, wafer, or other object being inserted into the bath. Structural supports, such as dummy metal features, are conventionally added or included on the wafer or panel to prevent pressure from the rolling seals breaking or damaging the wafer or wafer structures as the wafer and wafer structure pass through each rolling seal.

An etch process using bowls and spinning the wafer has also been utilized in some cases for processing semiconductor wafers. The bowl method for etching semiconductor wafers is significantly more expensive given process times, which can exceed 10 minutes and can require substantial capital equipment investment for multiple bowls and related automation. The bowl method does in some cases have the process control and maintenance advantage of single use chemical solutions, eliminating the maintenance of recirculating baths associated with submersion methods.

SUMMARY

On opportunity exists for improved semiconductor manufacturing. Accordingly, in one aspect, a method of removing material from a semiconductor device can include providing a semiconductor substrate comprising a length L, a first surface, and a second surface opposite the first surface. A layer of material can be formed over the first surface of the semiconductor substrate. A conveyor can be provided with a first air-knife disposed over the conveyor and a second air-knife disposed over the conveyor and offset from the first air-knife by a distance D that is less than the length L of the semiconductor substrate. The semiconductor substrate can be placed on the conveyor with the layer of material oriented facing away from the conveyor, the semiconductor substrate being placed on the conveyor before the first air-knife and before the second air-knife. The semiconductor substrate can advance along the conveyor and under the first air-knife so that a portion of the semiconductor substrate is disposed between the first air-knife and the second air-knife. A pool of etching solution can be formed by dispensing an etching solution onto the layer of material over the portion of the semiconductor substrate disposed between the first air-knife and the second air-knife. A portion of the layer of material disposed between the first air-knife and the second air-knife can be etched with the pool of etching solution. The pool of etching solution and at least a portion of the layer of material etched by the pool of etching solution can be removed from the surface of the semiconductor substrate by moving the semiconductor substrate along the conveyor and past the second air-knife.

The method of removing material from a semiconductor device can further comprise the semiconductor substrate comprising a native semiconductor wafer, a reconstituted semiconductor wafer, a panel, a fan-out wafer or panel, an embedded die panel, a chip carrier substrate, a printed circuit board (PCB), or a printed wiring panel. The first and second air knives can be formed of airflows comprising widths of 1-20 mm and lengths greater than 200 mm in which the airflow moves at a speed greater than or equal to 0.1 meters per second. The pool of etching solution can move across the semiconductor substrate at a rate in a range of 50-100 millimeters per minute to provide the layer of material adequate time and exposure with the pool of etching solution to be completely removed in 15-300 seconds. The first air-knife and the second air-knife can agitate the pool of etching solution on the layer of material to be removed to improve etching.

In another aspect, a method of removing at least a portion of a layer of material from over a semiconductor substrate can comprise dispensing an etching solution over the semiconductor substrate to form a pool of etching solution on the layer of material over the semiconductor substrate, wherein a footprint of the pool of etching solution is less than a footprint of the semiconductor substrate, and moving at least one of the pool of etching solution with respect to the semiconductor substrate or the semiconductor substrate with respect to the pool of etching solution. A pool boundary of the pool of etching solution can be defined on the semiconductor substrate with at least one air-knife such that the pool of etching solution etches the layer of material over the semiconductor substrate within the footprint of the pool of etching solution. The etching solution and at least a portion of the layer of material etched by the etching solution can be removed with the at least one air-knife.

The method of removing at least a portion of a layer of material from over a semiconductor substrate can further comprise the semiconductor substrate comprising a native semiconductor wafer, a reconstituted semiconductor wafer, a panel, a fan-out wafer or panel, an embedded die panel, a chip carrier substrate, a printed circuit board (PCB), or a printed wiring panel. Moving at least one of the pool of etching solution with respect to the semiconductor substrate or the semiconductor substrate with respect to the pool of etching solution can further comprise placing the semiconductor substrate on a conveyor that moves the semiconductor substrate with respect to a fixed position of the at least one air-knife. Moving at least one of the pool of etching solution with respect to the semiconductor substrate or the semiconductor substrate with respect to the pool of etching solution can further comprise moving the at least one air-knife with respect to a fixed position of the semiconductor substrate. Moving at least one of the pool of etching solution with respect to the semiconductor substrate or the semiconductor substrate with respect to the pool of etching solution can further comprise moving the at least one air-knife in a first direction and moving the semiconductor substrate in a second direction substantially opposing the first direction. Containing the etching solution on the semiconductor substrate can be done by a first air-knife and a second air-knife offset from the first air-knife. The first and second air knives can be formed of airflows comprising widths of 1-20 mm and lengths greater than 200 mm in which the airflow moves at a speed greater than or equal to 0.1 meters per second. The etching solution and the at least a portion of the layer of material etched by the etching solution can be removed by the second air-knife.

In another aspect, a method of removing at least a portion of a layer of material from over a semiconductor substrate can comprise providing a first air-knife, providing a second air-knife offset from the first air-knife, the offset defining an etching area between the first air-knife and the second air-knife, and moving at least one of the semiconductor substrate, the first air-knife, or the second air-knife so that the semiconductor substrate passes through the etching area. An etching solution can be dispensed onto the layer of material over the semiconductor substrate in the etching area to form a pool of etching solution. A portion of the layer of material within the etching area can be etched with the pool of etching solution, and the pool of etching solution and at least a portion of the layer of material etched by the etching solution can be removed from the semiconductor substrate.

The method of removing at least a portion of a layer of material from over a semiconductor substrate can further comprise the semiconductor substrate comprising a native semiconductor wafer, a reconstituted semiconductor wafer, a panel, a fan-out wafer or panel, an embedded die panel, a chip carrier substrate, a printed circuit board (PCB), or a printed wiring panel. Moving at least one of the pool of etching solution with respect to the semiconductor substrate or the semiconductor substrate with respect to the pool of etching solution can further comprise placing the semiconductor substrate on a conveyor that moves the semiconductor substrate with respect to a fixed position of the at least one air-knife. Moving at least one of the pool of etching solution with respect to the semiconductor substrate or the semiconductor substrate with respect to the pool of etching solution can further comprise moving the at least one air-knife with respect to a fixed position of the semiconductor substrate. Moving at least one of the pool of etching solution with respect to the semiconductor substrate or the semiconductor substrate with respect to the pool of etching solution can further comprise moving the at least one air-knife in a first direction and moving the semiconductor substrate in a second direction substantially opposing the first direction. The first and second air knives can be formed of airflows comprising widths of 1-20 mm and lengths greater than 200 mm in which the airflow moves at a speed greater than or equal to 0.1 meters per second. The method can further comprise containing the pool of etching solution on the semiconductor substrate with the first air-knife and the second air-knife, and removing the pool of etching solution and the at least a portion of the layer of material etched by the second air-knife.

The foregoing and other aspects, features, and advantages will be apparent to those artisans of ordinary skill in the art from the DESCRIPTION and DRAWINGS, and from the CLAIMS.

DETAILED DESCRIPTION

Figure 1A:
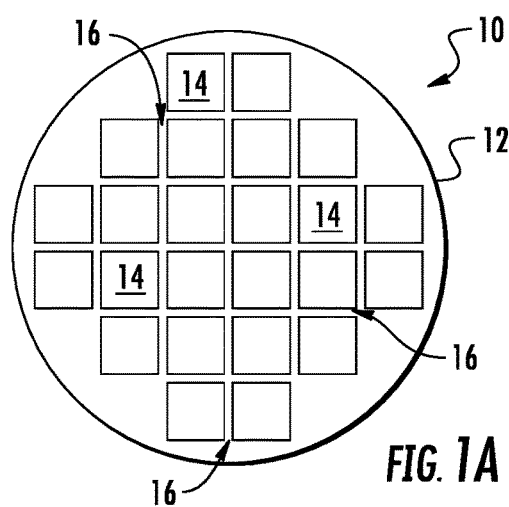
FIGS. 1A-1C illustrate a native wafer or substrate comprising a plurality of semiconductor die and a conductive layer disposed over the plurality of semiconductor die.

The present disclosure includes one or more aspects or embodiments in the following description with reference to the figures, in which like numerals represent the same or similar elements. Those skilled in the art will appreciate that the description is intended to cover alternatives, modifications, and equivalents as may be included within the spirit and scope of the disclosure as defined by the appended claims and their equivalents as supported by the following disclosure and drawings. In the description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGs. are illustrative representations and are not necessarily drawn to scale.

This disclosure, its aspects and implementations, are not limited to the specific equipment, material types, or other system component examples, or methods disclosed herein. Many additional components, manufacturing and assembly procedures known in the art consistent with manufacture and packaging are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation.

The word "exemplary," "example," or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisoprenes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface can be beneficial or required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. Alternatively, mechanical abrasion without the use of corrosive chemicals is used for planarization. In some embodiments, purely mechanical abrasion is achieved by using a belt grinding machine, a standard wafer backgrinder, or other similar machine. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer can be cut along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, redistribution layers, or wirebonds. An encapsulant or other molding material is deposited over the package to provide physical support and electrical isolation. The finished package is then inserted into an electrical system and the functionality of the semiconductor device is made available to the other system components.

The electrical system can be a stand-alone system that uses the semiconductor device to perform one or more electrical functions. Alternatively, the electrical system can be a subcomponent of a larger system. For example, the electrical system can be part of a cellular phone, personal digital assistant (PDA), digital video camera (DVC), or other electronic communication device. Alternatively, the electrical system can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction can be beneficial or essential for the products to be accepted by the market. The distance between semiconductor devices must be decreased to achieve higher density.

By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 1B:
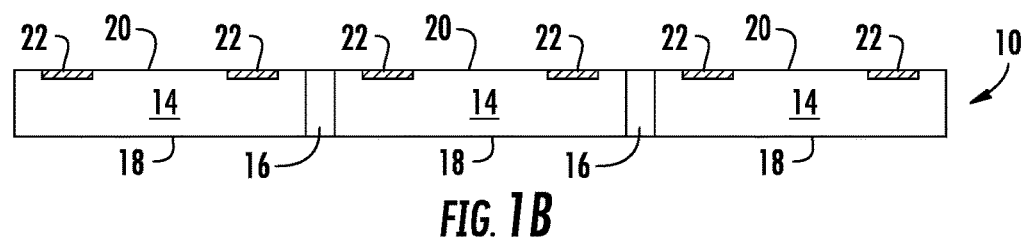
Figure 1C:
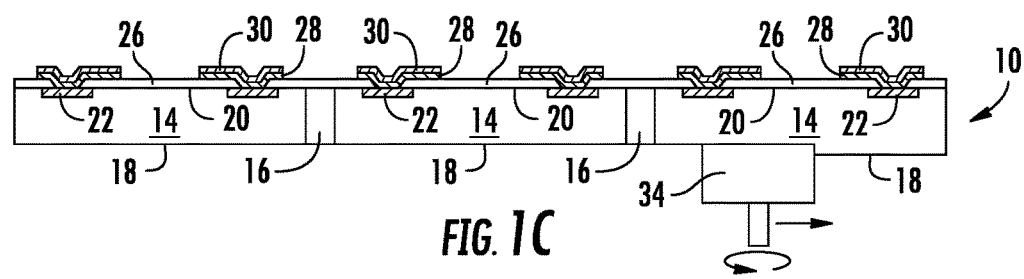

FIGS. 1A-1C show a plurality of semiconductor die that have been formed according to front-end manufacturing methods and procedures as outlined above. More specifically, FIG. 1A shows a semiconductor wafer or semiconductor substrate 10 with a base substrate material 12, such as, without limitation, silicon, germanium, gallium arsenide, indium phosphide, or silicon carbide, for structural support. A plurality of semiconductor die or components 14 is formed on wafer 10 separated by a non-active, inter-die wafer area or saw street 16 as described above. Saw streets 16 provide cutting areas to singulate semiconductor wafer 10 into individual semiconductor die 14.

FIG. 1B shows a cross-sectional view of a portion of semiconductor wafer 10. Each semiconductor die 14 has a backside or back surface 18 and an active surface 20 opposite the backside. Active surface 20 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 20 to implement analog circuits or digital circuits, such as DSP, ASIC, memory, or other signal processing circuit. Semiconductor die 14 may also contain IPDs such as inductors, capacitors, and resistors, for RF signal processing.

An electrically conductive layer or contact pads 22 is formed over active surface 20 using PVD, CVD, electrolytic plating, electroless plating process, or other suitable metal deposition process. Conductive layer 22 can be one or more layers of aluminum (Al), copper (Cu), tin (Sn), nickel (Ni), gold (Au), silver (Ag), or other suitable electrically conductive material. Conductive layer 22 operates as contact pads or bond pads electrically coupled or connected to the circuits on active surface 20. Conductive layer 22 can be formed as contact pads disposed side-by-side a first distance from the edge of semiconductor die 14, as shown in FIG. 1B. Alternatively, conductive layer 22 can be formed as contact pads that are offset in multiple rows such that a first row of contact pads is disposed a first distance from the edge of the die, and a second row of contact pads alternating with the first row is disposed a second distance from the edge of the die.

FIG. 1C shows an optional insulating or passivation layer 26 conformally applied over active surface 20 and over conductive layer 22. Insulating layer 26 can include one or more layers that are applied using PVD, CVD, screen printing, spin coating, spray coating, sintering, thermal oxidation, or other suitable process. Insulating layer 26 can contain, without limitation, one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), polymer, polyimide, benzocyclobutene (BCB), polybenzoxazoles (PBO), or other material having similar insulating and structural properties. Alternatively, semiconductor die 14 are packaged without the use of any PBO layers, and insulating layer 26 can be formed of a different material or omitted entirely. In another embodiment, insulating layer 26 includes a passivation layer formed over active surface 20 without being disposed over conductive layer 22. When insulating layer 26 is present and formed over conductive layer 22, openings are formed completely through insulating layer 26 to expose at least a portion of conductive layer 22 for subsequent mechanical and electrical interconnection. Alternatively, when insulating layer 26 is omitted, conductive layer 22 is exposed for subsequent electrical interconnection without the formation of openings.

FIG. 1C also shows a seed layer or an electrically conductive layer 28 is formed over and coupled or connected to, conductive layer 22. Seed layer 28 can be formed directly on conductive layer 22 using patterning and metal deposition processes such as printing, PVD, CVD, sputtering, electrolytic plating, electroless plating, metal evaporation, metal sputtering, or other suitable metal deposition process. Seed layer 28 can be one or more layers of Al, Cu, Sn, Ni, Au, Ag, Ti/Cu, TiW/Cu, or a coupling agent/Cu. The seed layer 28 can be deposited by sputtering, by electroless plating, by depositing laminated Cu foil combined with electroless plating, or other suitable process. In an embodiment, the seed layer 28 can be planar or substantially planar, covering an entirety of insulating layer 26, openings in the insulating layer 26, and contact pads 22. The seed layer 28 can also cover the semiconductor die 14 and the saw streets 16.

FIG. 1C further shows a conductive layer, conductive pattern, or RDL 30 is formed or disposed over the seed layer 28 to form a conductive interconnect structure, such as an RDL, traces, contact pads, or other portion of a fan-in, fan-out, or other interconnect structure. Conductive layer 30 can be one or more layers of Al, Cu, Sn, Ni, Au, Ag, or other suitable electrically conductive material. The deposition of conductive layer 30 can use wafer-like processing that includes the seed layer 28 as part of an additive process, such as PVD, CVD, electrolytic plating, electroless plating, or other suitable process. In an embodiment, conductive layer 30 is formed over seed layer 28 by a plating process that uses conductive layer 30 as a plating surface. Conductive layer 30 can provide mechanical and electrical interconnection between contact pads 22 and other subsequently formed package structures, including bumps or package interconnect structures that provide for the transmission of electrical signals between semiconductor die 14 and points external to a final semiconductor package.

A portion of the seed layer 28 that is not within a footprint of the conductive layer 30 can be removed to provide electrical isolation and prevent shorting along the conductive layer 30 a final package containing the semiconductor die 14. In some instances, an insulating photosensitive material, or resist layer can be formed over the seed layer 28 and define an area or pathways within which the conductive layer 30 will be formed. After formation of the conductive layer 30 on the seed layer 28, the insulating layer can be removed by a stripping process. Similarly, portions of the seed layer 28 exposed by removal of the conductive layer 30 can be removed by an etching process. Stated another way, portions of the seed layer 28 that are not within a footprint of the conductive layer 30 or are uncovered by the conductive layer 30 can be removed by an etching process. After removal of portions of the seed layer 28, the footprint of the seed layer 28 and the conductive layer 30 can be identical or substantially identical to each other, as shown in FIG. 1C. Additional detail regarding a process for removal of layers on a semiconductor substrate, such as removal of the seed layer 28 and removal of the insulating layer from over the surface of the seed layer 28, such as by stripping or etching, is discussed below with respect to FIGS. 3A-3E.

FIG. 1C further shows wafer 10 can undergo an optional grinding operation with grinder 34 to planarize back surface 18 and reduce a thickness of the wafer 10. A chemical etch can also be used to remove and planarize a portion of wafer 10. The wafer 10 can also be singulated into individual semiconductor die 14 through saw streets 16 using a saw blade or laser cutting tool either before or after subsequent processing to the semiconductor die 10 and to the semiconductor die 14.

Figure 2A:
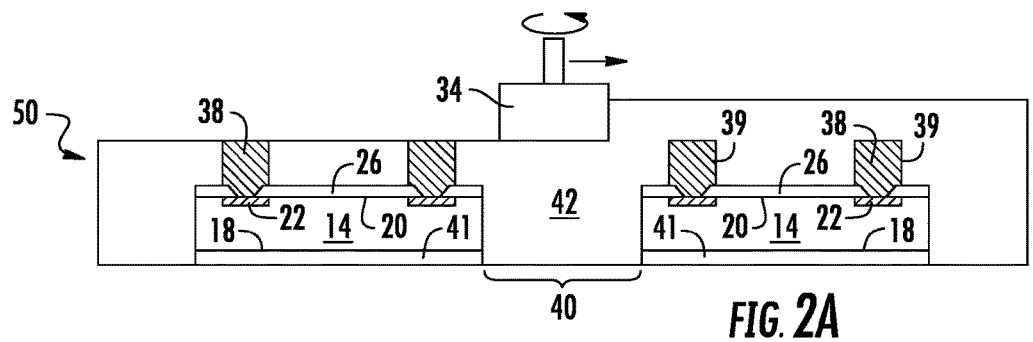
FIGS. 2A-2E illustrate an embedded die panel or substrate comprising a plurality of semiconductor die coupled to conductive interconnects and a conductive layer disposed over the plurality of semiconductor die.

FIG. 2A shows semiconductor die 14, similar to the semiconductor die 14 from FIGS. 1A and 1B, in which electrical interconnect structures 38 can be optionally coupled to the semiconductor die 14. The electrical interconnect structures 38 can be formed as copper columns, copper pillars, or copper posts and are disposed over, and coupled or connected to, contact pads 22. The interconnect structures 38 can be formed directly on contact pads 22 using patterning and metal deposition processes such as printing, PVD, CVD, sputtering, electrolytic plating, electroless plating, metal evaporation, metal sputtering, or other suitable metal deposition process. Interconnect structures 38 can be one or more layers of Al, Cu, Sn, Ni, Au, Ag, palladium (Pd), or other suitable electrically conductive material and can include one or more UBM layers. In an embodiment, a photoresist layer can be deposited over semiconductor die 14 and contact pads 22. A portion of the photoresist layer can be exposed and removed by an etching development process. Electrical interconnect structures 38 can then be formed as copper pillars in the removed portion of the photoresist and over contact pads 22 using a selective plating process. The photoresist layer can be removed leaving interconnect structures 38 that provide for subsequent mechanical and electrical interconnection and a standoff with respect to active surface 20 and insulating layer 26, if present. Preferably, interconnect structures 38 include a height in a range of 10-100 micrometers (μm), 20-50 μm, or about 35 μm.

The semiconductor die 14 with optional electrical interconnect structures 38 can be disposed within, and form part of, a panel or embedded die panel 50. An adhesive 41 can optionally be disposed on a backside 18 of semiconductor die 14. The adhesive 41 can be thermal epoxy, epoxy resin, B-stage epoxy film, ultraviolet (UV) B-stage film with optional acrylic polymer, or other suitable material. In an embodiment, the adhesive 41 can be disposed over backside 18 before semiconductor die 14 are mounted over, or to, a temporary carrier that can be used in the formation of embedded die panel 50.

The semiconductor die 14 can be separated by a space or gap 40 within the panel 50, the space 40 providing an area for a subsequently formed fan-out interconnect structure. A size of gap 40 includes sufficient area for optionally mounting semiconductor devices or components to be included within a final semiconductor device or package, such as a FOWLP. The space 40 can be maintained and filled between the semiconductor die 14 with an encapsulant 42 that can be deposited using a paste printing, compression molding, transfer molding, liquid encapsulant molding, lamination, vacuum lamination, spin coating, or other suitable applicator. The encapsulant 42 can be a polymer composite material, such as epoxy resin with filler, epoxy acrylate with filler, or polymer with proper filler. The encapsulant 42 can be formed as a single material that is disposed over and around semiconductor die 14 and electric interconnect structures 38. The encapsulant 42 can be in contact with sidewalls 39 of the electric interconnect structures 38 and also be disposed between the interconnect structures 38.

The panel 50 can optionally undergo a curing process to cure the encapsulant 42. The panel 50 can include a footprint or form factor of any shape and size. In some instances, the panel 50 can include a form factor similar to the form factor of the substrate 10, such as a 300 millimeter (mm) semiconductor wafer and includes a circular footprint having a diameter of 300 mm. The panel 50, like substrate 10, can be of any desirable size or shape such as circular, square, or rectangular, that can be formed of any desirable size.

FIG. 2A also shows the panel 50 can undergo an optional grinding operation with grinder 34 to planarize the surface and reduce a thickness of the panel. A chemical etch can also be used to remove and planarize a portion of the encapsulant 42 in the panel 50. Thus, a surface of interconnect structures 38 can be exposed with respect to encapsulant 42 at an outer surface or periphery of the panel 50 to provide for electrical connection between the semiconductor die 14 and a subsequently formed interconnect structure, such as a fan-out interconnect structure.

Figure 2B:
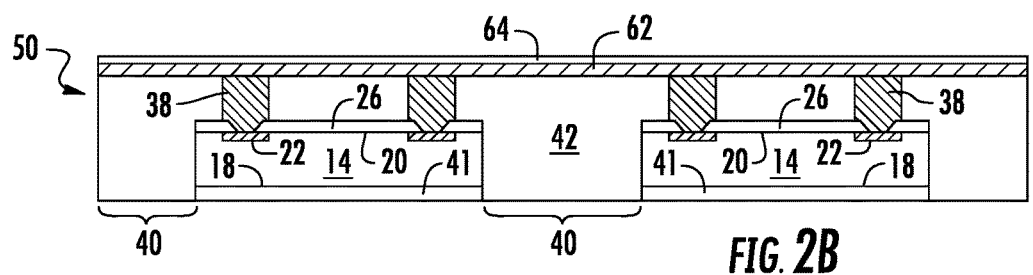

FIG. 2B shows a seed layer or electrically conductive layer 62 is formed over panel 50. Seed layer 62 can be one or more layers of Al, Cu, Sn, Ni, Au, Ag, Ti/Cu, TiW/Cu, or a coupling agent/Cu. The seed layer 62 is deposited by sputtering, by electroless plating, by depositing laminated Cu foil combined with electroless plating, or other suitable process. In an embodiment, the seed layer 62 is planar and covers an entirety of a footprint of the panel 50. Thus, conductive layer 62 can cover both the top surface or an area over semiconductor die 14 as well as a peripheral area disposed outside a footprint of the semiconductor die, such as gaps 40.

FIG. 2B further shows insulating or passivation layer 64 is conformally applied over panel 50 and contacts conductive layer 62. Insulating layer 64 can be one or more layers that are applied using PVD, CVD, screen printing, spin coating, spray coating, sintering, or thermal oxidation. Insulating layer 64 contains one or more layers of SiO2, Si3N4, SiON, Ta2O5, Al2O3, polyimide, BCB, PBO, a photosensitive layer, or other material having similar insulating and structural properties. In an embodiment, insulating layer 64 is a dry film resist layer.

Figure 2C:
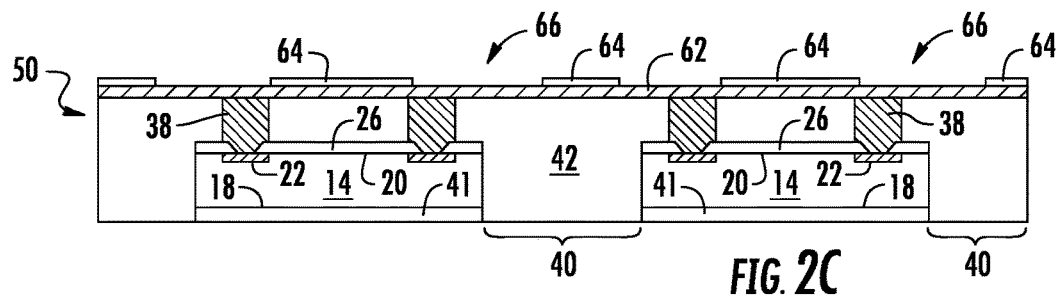

FIG. 2C shows the insulating layer 64 can be patterned and a portion the insulating layer 64 can be removed by etching, laser drilling, mechanical drilling, or other suitable process to form openings 66 completely through the insulating layer 64 and to expose the conductive layer 62. The insulating layer 64 can be patterned to facilitate the subsequent formation of an electrically conductive layer, conductive pattern layer, or RDL 68. The conductive layer 68 can include pads and traces that can be formed within the openings 66 in the insulating layer 64 as part of a fan-out interconnect structure for semiconductor die 14.

Figure 2D:
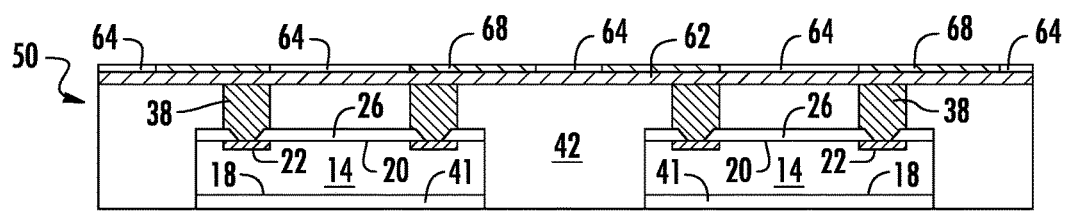

FIG. 2D, continuing from FIG. 2C, shows a cross-sectional view of a portion of panel 50 in which conductive layer 68 is patterned and deposited over encapsulant 42, interconnects 38, and seed layer 62, to form RDLs as part of an interconnect structure. The conductive layer 68 can be one or more layers of Al, Cu, Sn, Ni, Au, Ag, or other suitable electrically conductive material. The depositing or formation of conductive layer 68 can use wafer-like processing that uses the seed layer 28 as part of an additive process on a molded panel, such as PVD, CVD, electrolytic plating, electroless plating, or other suitable process. In an embodiment, conductive layer 68 is formed over seed layer 62 by a plating process that uses conductive layer 62 as a plating surface. The conductive layer 68 can provide mechanical and electrical interconnection between electrical interconnect structures 38 and subsequently formed bumps or package interconnect structures that provide for the transmission of electrical signals between the semiconductor die 14 and points external to a final semiconductor package.

Figure 2E:
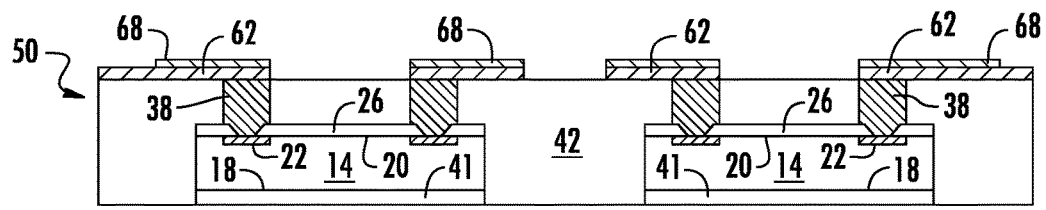

FIG. 2E shows the panel 50 after removal of the insulating layer 64 and removal of the portion of seed layer 62 exposed by openings 66, or not contained within a footprint of the insulating layer 64. Portions of the seed layer 62 not covered by conductive layer 68 are removed to facilitate the subsequent formation of additional conductive structures by a plating process without causing electrical shorting within the package through the seed layer 62. In an embodiment, the insulating layer 64 is a resist layer that is removed by a stripping process and conductive layer 62 is a seed layer removed by an etching process. In either event, removal of a desired portions of the seed layer 62 and the insulating layer 64, can be accomplished with the use of a pool of etching solution or stripping solution, as described in greater detail below with respect to FIGS. 3A-3E and 4A-4F.

Figure 3A:
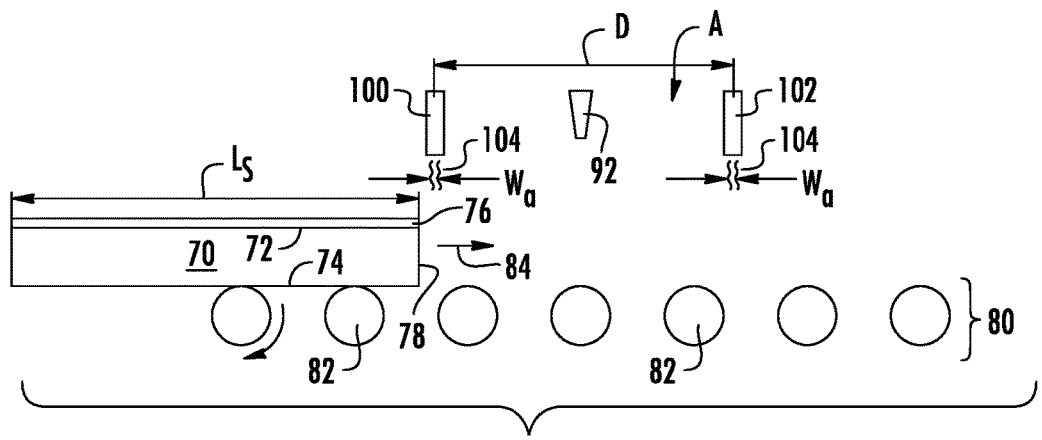
FIGS. 3A-3E illustrate various stages of a pool of etching solution being used to remove a material from a surface of a substrate.

FIG. 3A shows a substrate 70 can be used as part of a method of using a pool of etching solution or stripping solution 90 for etching or removal of a material 72 used in the context of semiconductor manufacturing. While not being limited to semiconductor manufacturing or semiconductor packaging, for convenience and ease of discussion, the use of the pool of etching solution 90 is described below with respect to conventional etching processes in semiconductor manufacture and with respect to the use of the pool of etching solution 90 for an improved method of semiconductor manufacture. However, the approach and methods for the pool of etching or stripping solution 90 can also be applicable to other processes, such as processes in the manufacture of liquid crystal displays (LCDs) for TV panels, or other similar applications, and is not limited to wafer level processing or semiconductor devices.

FIG. 3A, continuing from FIG. 1C or 2E, shows the substrate 70, which includes a semiconductor substrate, a native semiconductor wafer, a reconstituted semiconductor wafer, a panel, a fan-out wafer or panel, an embedded die panel, a chip carrier substrate, a PCB, a printed wiring panel, or a derivative thereof, and can be similar or identical to wafer 10 or panel 50. The substrate 70 comprises a first or top surface 72 and a second of bottom surface 74 opposite the first surface. The substrate 70 comprises a length L, which when the substrate 70 is formed comprising a circular footprint, the length L is equal to a diameter of the substrate 70.

A material or layer of material 76 can be formed of one of more layers disposed over the substrate 70 and over the first surface 72. The material 76 can also be formed over, or directly contacting, the first surface 74. The material 76 can comprise one or more layers of a conductive layer, a conductive seed layer, an insulating layer, a photoresist material, or a photoresist material, and can be similar or identical to one or more of seed layer 28, the insulating layer formed over seed layer 28, seed layer 62, or insulating layer 64. Thus, while the undesired material 76 to be removed can include, in the context of semiconductor manufacturing or packaging for example, a conductive seed layer used in forming an electro-plated redistribution layer (RDL), material 76 is need not be limited to seed layers, or to methods for the making or manufacture of semiconductor products.

FIG. 3A also shows a conveyor 80, onto which the substrate 70 can be placed for conveying or moving the substrate 70 for subsequent processing. In some instances, the conveyor 80 can comprise a number of rollers or wheels 82 that rotate to advance the substrate 70 along the conveyor 80. The rollers 82 can be coupled to one or more moving drive elements, such as rotating shafts, that allow the conveyor 80 to convey an object, such as the substrate 70. The substrate 70 can be merely set on, or placed above, the conveyor 80 without additional mechanical attachment, and can advance the substrate 70 along the conveyor 80 through the friction resulting from contact between the bottom surface 74 of the substrate 70 and the conveyor 80. Alternatively, additional mechanical attachment can be used, such as a jig, together with any desirable arrangement of conveyor 80, that advances the substrate 70 along a desired path and at a desired speed. In some instances, limited, minimal, or no additional attachment mechanisms beyond friction between the substrate 70 and the conveyor 80 can be used to limit processing time and eliminate or reduce time needed for coupling the substrates 70 to the conveyor 80. As a non-limiting example, the conveyor 80 shown in FIGS. 3A-3E moves objects from the left side of the conveyor 80 to the right side of the conveyor 80, although other arrangements could be used, such as right to left, or others.

The conveyor 80 can comprise a width We substantially equal to, or larger than, a size of one or more substrates 70 that would be used, such as greater than or equal to 200 mm, 300 mm, or 600 mm or more for a single substrate 70 and wider for multiple substrates 70 to be processed in a side-by-side arrangement. The conveyor 80 can comprise a width We substantially equal to, smaller than, or larger than, the length La of one or more of the first air-knife generator 100, the second air-knife generator 102, the first air-knife 104, or the second air-knife 106. A length Lc of the conveyor 80 and a speed at which the conveyor 80 advances the substrate 70 can also be controlled and modified depending on an amount of time needed for a particular etching or removal process for the material 76.

One or more air-knife generators, fans, or blowers, together with one or more air-knives can also be disposed over the conveyor 80, the air-knives manipulating or controlling a pool of the etching solution 90 on the substrate 70 for the removal of the material 76. More specifically, FIG. 3A shows providing a first air-knife generator 100 disposed over the conveyor 80, and further providing a second air-knife generator 102 disposed over the conveyor 80 and offset from the first air-knife 100 by a distance D that is less than the length Ls of the substrate 70. For ease of description, the first air-knife generator to pass over the substrate 70, e.g. the air-knife generator shown on the left side of the FIGs., is referred to as the first air-knife generator 100. Similarly, the second air-knife generator 102 is the second air-knife generator to pass over the substrate 70, e.g., the air-knife generator shown on the right of FIGs. The air-knife generators can each generate one or more air-knives, and as such, the first air-knife generator 100 can generate a first air-knife 104 disposed over the conveyor 80. Similarly, the second air-knife generator 102 can generate a second air-knife 106 disposed over the conveyor 80 that is offset from the first air-knife 102 by a distance D that is less than the length Ls of the substrate 70.

The first air-knife 104 and the second air-knife 106 can be areas or bands of air, such as pressurized or compressed air, that exits, flows, or blows from the first and second air-knife generators 100 and 102, respectively, and is contained within specific limits or within desired areas. The cross-sectional view of FIG. 3A shows that the air-knives 104 and 106 can each comprise an air-knife width Wa. The air-knives 104 and 106 can be thin and long, similar in shape to a knife blade. In some instances, the width Wa of the first air-knife 104 and the second air-knife 106 can be equal or substantially equal to each other, while in other instances, the widths Wa of the first air-knife 104 and the second air-knife 106 can be different from each other. The width Wa of the first air-knife 104 and the second air-knife 106 can also be equal or substantially equal to a width of the first air-knife generator 100 and the second air-knife generator 102. In any event, the widths Wa can be in a range of 1-20 mm, or 1-40 mm. In some instances the width Wa of the first air-knife 104 can be the same or substantially the same as a width of the first air-knife generator 100. The first air-knife 104 and the second air-knife 106 can also include a length La that is perpendicular or substantially perpendicular to the width Wa, and would extend into the page in the view shown in FIG. 3A. The lengths La can be greater than 200 mm, greater than 300 mm, greater than 600 mm, or greater than a width Ws of the substrate 70, or greater than or equal to width of the conveyor 80. As such, an etching area A can be defined by an area with a length equal to or substantially equal to distance D and a width equal or substantially equal to the length La. A speed of the airflow or movement of air in the first air-knife 104 and the second air-knife 106 can be greater than or equal to 0.1 meters per second, such as in a direction towards the substrate 70. In some instances, the airflow or movement of air in the first air-knife 104 and the second air-knife 106 can be optionally heated or cooled.

FIG. 3A also shows placing the substrate 70 on the conveyor 80 with a layer of the material 76 oriented or facing away from the conveyor 80, the substrate 70 being placed on the conveyor 80 outside a footprint of the distance D, outside the etching area A, and before the first air-knife 104 and before the second air-knife 106. The substrate 70 can advance along the conveyor 80 in a direction 84, to move the substrate 70 under the first air-knife 100 so that a portion of the substrate 70 is disposed between the first air-knife 104 and the second air-knife 104. The direction 84 can be in a direction of the length of the conveyor 80, in a direction of the movement of the conveyor 80 or any other suitable direction for the processing of substrate 70. The substrate 70 can move across the conveyor 80 or toward one or more of the first air-knife generator 100, the second air-knife generator 102, the first air-knife 104, and the second air-knife 106 at a rate in a range of 50-100 mm per minute (mm/min) to provide the layer of material 76 adequate time and exposure with the pool of etching solution 90 to be completely removed in any amount of time within a range of 15-300 seconds. While processing time can vary, and can be directly proportional to a length of the conveyor 80, a speed of the conveyor 80, chemical composition of the material 76 and the pool 90, temperature, or any combination thereof processing will typically be for a time less than 1 minute in duration. Adjusting parameters can also enable processing times to be performed in under 10 minutes, 5 minutes, 3 minutes, or two minutes.

Furthermore, while the process is described, and can be thought of, with respect to moving the substrate 70 with respect to one or more of the first air-knife generator 100, the second air-knife generator 102, the first air-knife 104, and the second air-knife 106, other variations can also be used. For example, a stationary substrate 70 can interact with moving air-knives to achieve relative movement of the substrate 70, the pool of etching or stripping solution 90, and one or more of the first air-knife generator 100, the second air-knife generator 102, the first air-knife 104. Additionally, both the substrate 70 and one or more of the first air-knife generator 100, the second air-knife generator 102, the first air-knife 104, and the second air-knife 106 can all be moving, such as in opposing directions. Therefore, FIG. 3A also shows moving at least one of the substrate 70, the first air-knife 104, or the second air-knife 106 so that the substrate 70 passes through the etching area A.

Figure 3B:
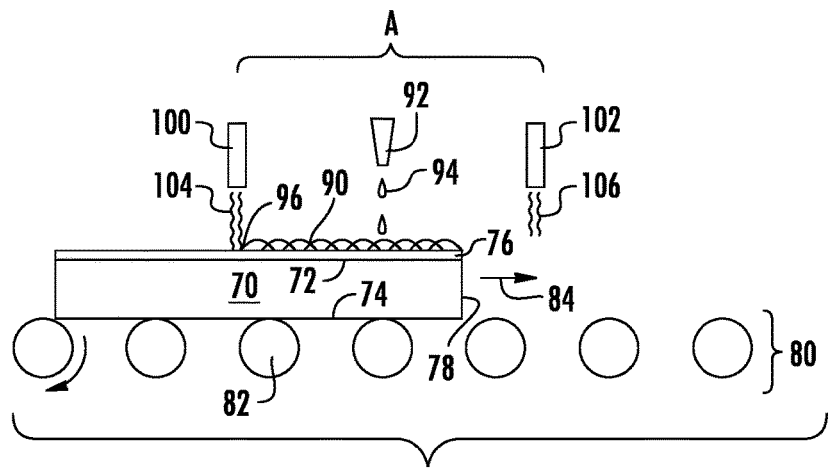

FIG. 3B shows a cross-sectional view similar to the cross-sectional view shown in FIG. 3A, but with a leading edge 78 of the substrate 70 advancing along the conveyor at the left side of FIG. 3B and passing under the first air-knife generator 100, the first air-knife 104, and into the etching area A. After the leading edge 78 of the substrate 70 advances under the first air-knife 104 and into the etching area A, so that at least a portion of the substrate 70 is below, or in-line with, the dispenser 92, a quantity of the etching solution, stripping solution, or chemical 94 can be dispensed over or onto the substrate 70 and be and contact the material 76. As shown in FIG. 3B, the etching solution 94 can be dispensed onto the substrate 70 at or near the leading edge 78. The etching solution 94 can be a process chemical, liquid, solution, or combination of liquids or solutions dispersed sequentially or simultaneously, to accomplish the desired etching or removal of at least a portion of the material 76. The dispenser 93 can be dispensed as part of an automated process, in which the etching solution 94 is dispensed such as through a stream or spray nozzle, supply line, or both. By dispensing the etching solution 94 directly onto the substrate 70 to form the pool 90 of etching solution 94, rather than immersing the substrate 70 into a bath of etching solution, significantly less etching solution 94 is required for the removal of material 76 from the substrate 70. Bath recirculation, filtering, and maintenance are also eliminated through a single-use pool solution. The reduction in etching solution 94 means that less etching solution is used, less etching solution is thrown away or disposed of after use, which can produce significant savings in material, maintenance, and operation costs.

The air-knives 104, 106, provide containment of the etching solution 94 as a pool 90 on the substrate 70. The pool 90 can be formed by dispensing the etching solution 94 onto the layer of material 76 over the portion of the substrate 70 disposed between the first air-knife 104 and the second air-knife 106. A portion of the layer of material 76 disposed between the first air-knife 104 and the second air-knife 106, or in the etching area A, can be etched by the pool 90 of etching solution 94. The air-knives can also provide a sufficient flow of air, or sufficient force contacting the substrate 70, to agitate the pool 90 of etching solution 94. Agitation of the pool 90 can cause the pool 90 to roll and appear to be boiling, which can help in the removal of the material 76 by having the pool 90 agitated and moving across and around the layer of material 76.

Agitation of the pool 90 of etching solution 94 provides a number of benefits. First, the agitation causes the pool 90 of etching solution 94 to spread and be evenly distributed across the substrate 70. Second, the agitation causes circulation or movement of the pool 90 of etching solution 94 across the material 76 be removed or etched, thereby providing constant localized replenishment of the active chemical in contact with the material 76 to be removed. Agitation, localized replenishment, or both of the etching solution 94 can increase a rate of etching or removal of the material 76 to be removed from the substrate 70, and as such can reduce an amount of time of required to perform the etching, thus improving processing efficiency and reducing cost.

Figure 3C:
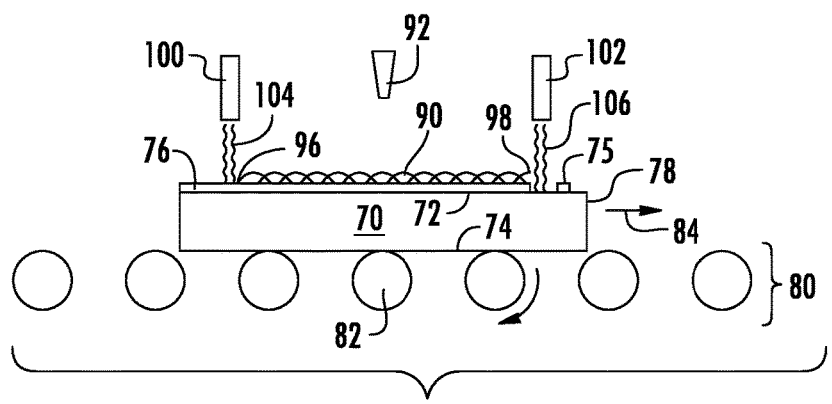
Figure 3D:
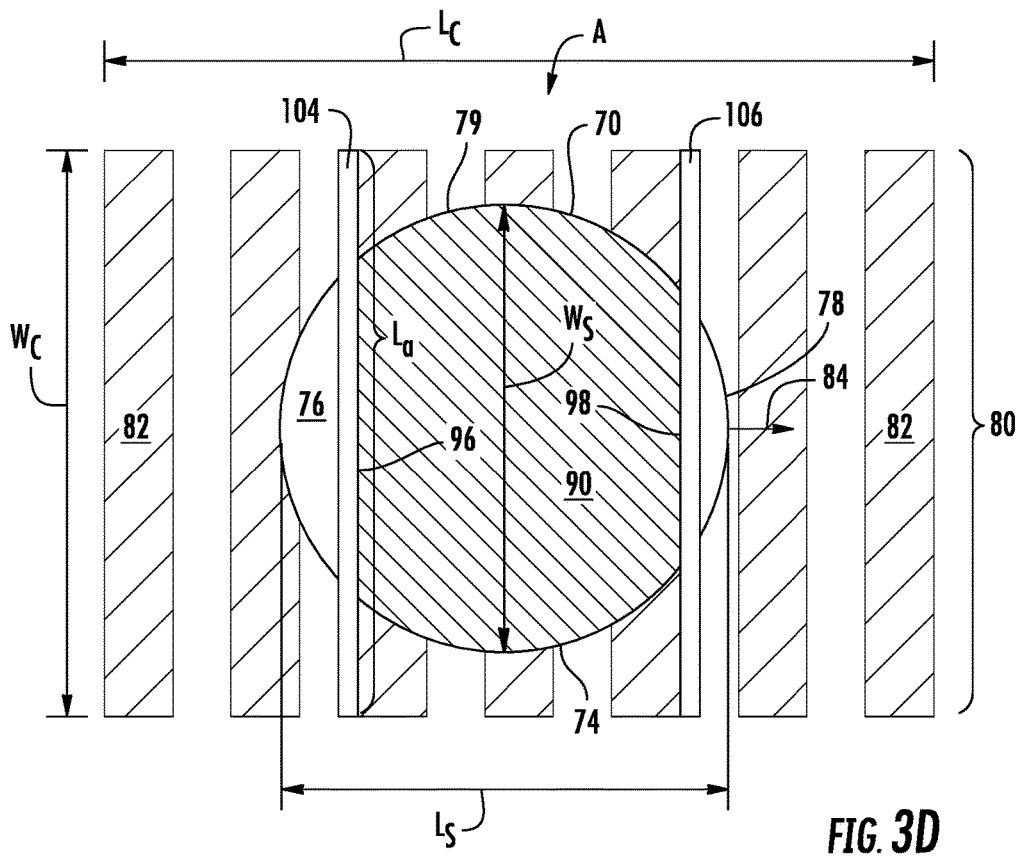

Continuing from FIG. 3B, FIG. 3C show an additional cross-sectional profile view similar to the view shown in FIG. 3C, and FIG. 3D shows a top or plan view of the view shown in FIG. 3C. FIGS. 3C and 3D show the first air-knife 104 establishing, or being used to establish, a first pool boundary or line 96 on the left side of the substrate 70 beyond which the pool 90 or etching solution 94 will not pass as the substrate 70 passes along the conveyor 80, or as the first air-knife 104 moves relative to the substrate 70. Similarly, the second air-knife 106 can establish, or be used to establish, a second pool boundary or line 98 on the right side of the substrate 70 beyond which the pool 90 or etching solution 94 will not pass as the substrate 70 passes along the conveyor 80, or as the second air-knife 106 moves relative to the substrate 70. Thus, when the substrate 70 is under both the first air-knife 104 and the second air-knife 106, a size or area of the pool 90 can be defined by the first air-knife 104 on the left, the second air-knife 106 on the right, and along edges or arcs 79 of the substrate 70 between the first air-knife 104 and the second air-knife 106. The surface tension of the etching solution 94 can prevent the etching solution 94 from falling off or leaving the substrate 70 and the material 76 where the pool 90 is not contained by boundary lines formed by air-knifes, such as the first pool boundary line 96 or the second pool boundary line 98. While two boundary lines 96 and 98 are described as a non-limiting example, additional lines or boundaries, such as one, three, four, or more lines or boundaries can also be used. Additionally, while the boundary lines 96 and 98 are shown as being straight, the boundaries or lines can also be curved, undulating, or formed in any desired shape.

An amount or volume of the etching solution 94 placed on substrate 70 can depend on the size of the substrate 70, the distance D or spacing between the first air-knife 104 and the second air-knife 106, as well as the surface tension of the etching solution 94. In some instances, all or substantially all of the etching solution 94 will remain on over the substrate 70 and the material 76, without spillage of the etching solution 94 away from the pool 90 or off the substrate 70 until forced off the substrate 70, such as by one or more of the air-knives, like the second air-knife 106.

By making the distance D of the pool 90 less than the Length L of the substrate 70, the size or area of the pool 90 can be less than that of the substrate 70 such that the pool 90 is smaller than, and contained within a footprint of, the substrate 70. When the pool 90 of etching solution 94 moves across the substrate 70, the pool 90 can move at a rate in a range of 50-100 mm/min to provide the material 76 adequate time and exposure with the pool 90 of etching solution 94 so the material 76 is completely removed in 15-300 seconds or in a timely fashion. The pool 90 can be moved by moving at least one of the 90 pool of etching solution 94 with respect to the substrate 70 or the substrate 70 with respect to the pool 90 of etching solution 94. In some instances, moving of the at least one of the pool 90 of etching solution 94 with respect to the substrate 70 or the substrate 70 with respect to the pool 90 of etching solution 94 can further comprise placing the substrate 70 on the conveyor 80 that moves the substrate 70 with respect to a fixed position of the at least one air-knife. In other instances, moving of the at least one of the pool 90 of etching solution 94 with respect to the substrate 70 or the substrate 70 with respect to the pool 90 of etching solution 94 can further comprise moving the at least one air-knife with respect to a fixed position of the substrate 70. In yet other instances, moving of the at least one of the pool 90 of etching solution 94 with respect to the substrate 70 or the substrate 70 with respect to the pool 90 of etching solution 94 can further comprise moving the at least one air-knife in a first direction and moving the substrate 70 in a second direction substantially opposing the first direction.

Figure 3E:
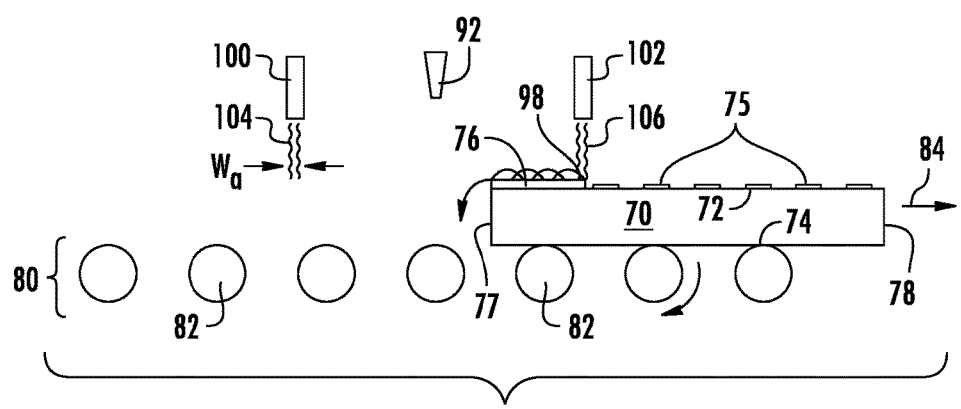

FIG. 3E, continuing from FIGS. 3C and 3D, show that once the substrate 70 is no longer under the first air-knife 104, the second air-knife 106 can operate as liquid-removing knife to remove the pool 90 of etching solution 94 from the substrate 70, including off the trailing edge or left side 77 of the substrate 70, or until all or substantially all of the pool 90 or solution 94 is removed from the substrate 70. Both the pool 90 and the at least a portion of the layer of material 76 etched by the etching solution 94 can be removed by the second air-knife 106, leaving a remaining or desired structure 75 from, or formed with, the material 76. The material 75 can comprise one or more layers of a conductive layer, a conductive seed layer, an insulating layer, a photoresist material, a photoresist material, or other desirable material or structure.

A position or time at which the etching solution or liquid 94 is disposed on the substrate 70 can be adjusted. Similarly, a location and amount of agitation or containment of the etching solution 94 can also be adjusted. In some processes, the etching solution 94 can be allowed to sit or remain in contact with the substrate 70 for a desired period of time without agitation before applying or delivering a desired amount of agitation. In some instances, agitation and containment can be omitted entirely so that the etching solution 94 is dispensed on the substrate 90, the etching solution 94 is left to process one or more materials or features on the substrate 70, of the material 76, or both, and then the etching solution 94 can be removed, such as with the air-knife 106, without immersion of the substrate 70 in a bath and without spinning in a bowl. In other instances, by including one or more air-knives 104, 106 for containment of the etching solution 94 and agitation of the etching solution 94 on the substrate 70, the etching process can occur more quickly, less space is required for conveyor 80, and multiple processes can occur at once, including agitation.

FIG. 3E also shows the last of the substrate 70 moving under or through the second air-knife 106 such that a final portion of the etching solution or liquid is removed from the substrate 70. The etching solution removed from the substrate 70 can be captured in a tank, basin, or catchment below the conveyer 80, and can be reused or disposed of. While FIGS. 3A-3E have shown one pool 90 moving with respect to the surface of the substrate 70, in some instances, more than one pool 90 can be used on the substrate 70. Multiple pools 90 can occur sequentially or simultaneously, and be spaced along a length Lc of the conveyor 80 or along a length Ls of the substrate 70.

Use of the pool 90 of etching solution 94 with air-knives 104, 106 allows for an in-line automated etching process that does not require fully immersing the substrate 70 into a bath of etching solution 94, or to passing the substrate 70 through rolling seals. As such, a need to include structural supports, such as dummy metal features or structures offset or extending away from a surface of the substrate 70 to prevent a surface of the substrate 70 from being damaged by the rolling seals can be eliminated and a risk of damage to the substrate 70 can be reduced, minimized, or eliminated. The current method of using the pool 90 of etching solution 94 with air-knives 104, 106 also allows for faster processing times with respect to an etch process using bowls, and further has the ability to maintain process control and have a maintenance advantage of single use chemical solutions, when desired, which can eliminate the maintenance of recirculating baths associated with submersion methods of etching.

Use of the pool 90 of etching solution 94 with air-knives 104, 106 for use in an in-line automated etching process can, in various instances, include: 1) placing the substrate 70 on the conveyor 80, 2) depositing etching solution 94 on the substrate 70 while the substrate 70 is on the conveyor 80, and 3) manipulating the etching solution 94 on the substrate 70 with air-knives, 104, 106, which allows for significantly faster processing times that can typically be less than 1 minute, incur less cost, and use less chemical solution than required with conventional etching systems and methods.

As such, automation can be increased to reduce processing times and labor to result in faster, lower cost, and more efficient etching or removal of materials. With the pool 90 of etching solution 94, less etching solution can be used than with conventional bath etching processes or methods. Additionally, in contrast to conventional etching baths, where large amounts of etching solution are present in the bath and are reused by multiple substrates during multiple treatments or etching processes, with the pool 90 the etching solution 94 need not be reused unless desired or advantageous. During multiple etching processes performed with the same etching solution in a bath, a quality or potency of the etching solution in the bath can decrease or degrade over time, becoming less effective, and requiring an inflow or replacement with new etching solution. To the contrary, the etching solution 94 in the pool 90 need not be reused for multiple treatments because a new pool 90 of the etching solution 94 can be new every time a new substrate 70 is treated with very little waste because very little etching solution 94 is needed for each use. Use of small quantities of new or fresh etching solution 94 for each substrate 70 allows for more precise use of the etching solution 94 with more predictable results obtained every time the process is performed. On the other hand, in some instances, etching solution 94 from pools 90 can be reclaimed, reused, or recycled a desired number of times while a desired level of effectiveness or reactivity is maintained.

While the pool 90 of etching solution 94 can be used for etching of metal, such as with the etching or removal of a seed layer 28, 62 used in plating conductive layer 30, or 68, other applications are also contemplated including additive processes such as applying organic surface protectant to copper (Cu) or other metallic surfaces to retard natural oxidation during subsequent use or storage. The method of using a pool of etching or stripping solution is also applicable to other removal or treatment processes, such as the stripping or removal of photoresist. An amount of pressure used for stripping or removing the etching solution or liquid can be the same or different from what is being used to remove the underlying material to which the etching solution has been applied, such as a photoresist material. As a non-limiting example, a stripping pressure of about 350 pounds per square inch (psi), or a pressure in a range of 300-370 psi, can be used for the removal of photoresist or other materials. Depending on specifics of a design of experiment (DOE) or optimization of a removal process, different removal technics can be used, including techniques relying on both chemical and physical processes for material removal. Additionally, solution temperature can also be considered and modified to optimize the removal of the desired material.

Figure 4A:
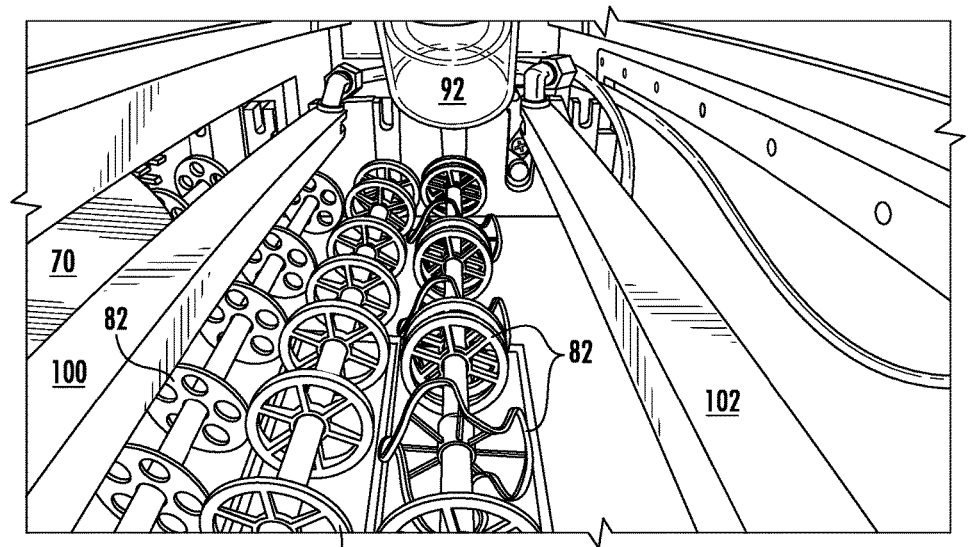
FIGS. 4A-4F illustrate photographs of various stages of a pool of etching solution being used to remove a material from a surface of a substrate.

FIGS. 4A-4F show a process similar or identical to the process described above with respect to FIGS. 3A-3E, but shows a series of photographs of a particular non-limiting embodiment rather than schematic line drawings as with FIGS. 3A-3E. More specifically, FIG. 4A shows a conveyor comprising a number of rotating drive shafts to which are coupled a plurality of black rollers that rotate together to convey an object, such as a substrate, wafer, fan-out wafer or panel, embedded die panel, or derivatives thereof, (herein collectively referred to as "substrate") from one side of the conveyor to the other. As a non-limiting example, the conveyor shown in FIGS. 4A-4F moves objects from the left side of the conveyor to the right side of the conveyor, although other arrangements could be used such as right to left, or others. As related above, the substrate can move with respect to stationary air-knives, or moving air-knives can move with respect to a stationary substrate, or both the air-knives and the substrate can be moving.

Figure 4B:
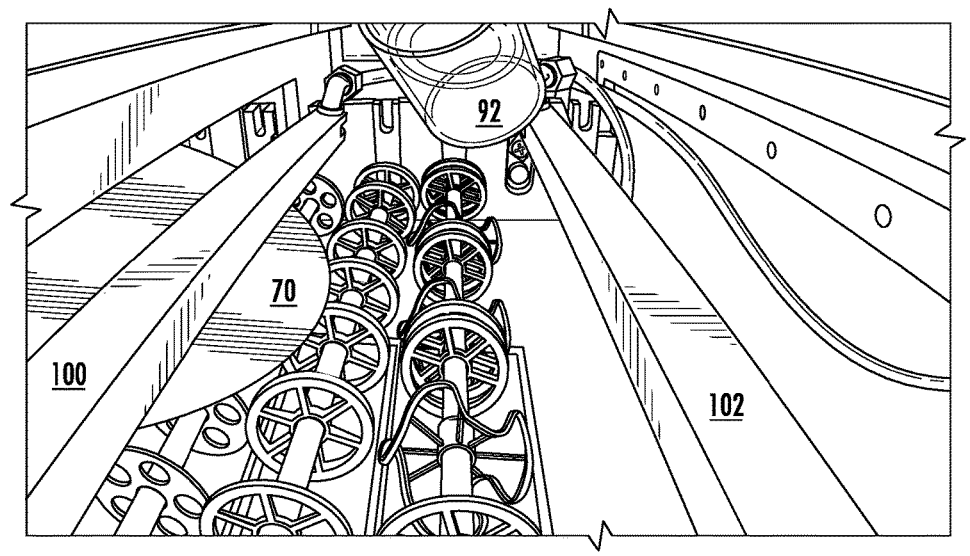

FIG. 4B shows a leading edge of a substrate coming into view on the left side of the conveyor. The substrate is shown with an upper surface of the substrate comprising a copper color from a metallic layer, such as a seed layer, formed over the top surface of the substrate. The substrate can be of any suitable shape, such as circular or rectangular, and can be of any suitable size, including a diameter, width, or length equal to or substantially equal to 300 mm, 600 mm, or more. Similarly, the conveyor can comprise a width substantially equal to, or larger than, a size of the largest substrate to be processed on the conveyor. A length of the conveyor and a speed at which the conveyor advances can also be controlled and modified depending on an amount of time needed for a particular process. For example, processing time can be directly proportional to conveyor length, speed, chemical composition, temperature, or any combination thereof. While an initial process will typically be under 1 minute in duration, there is no limitation to adjusting parameters to enable traditional bath etches taking over 1 hour to be performed in under 10 minutes.

Figure 4C:
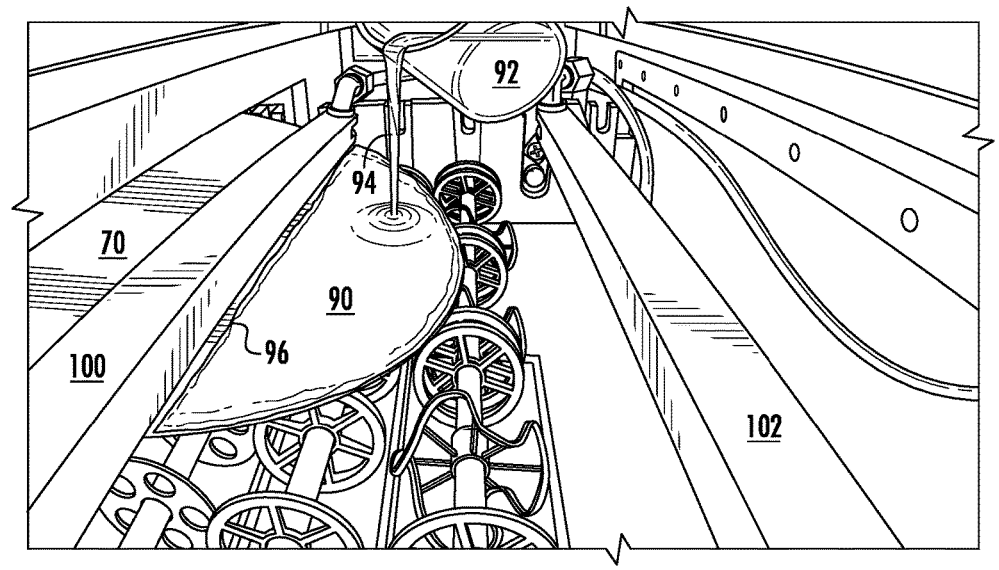

FIG. 4C shows an etching solution, process chemical, or liquid (hereinafter etching solution) being dispensed onto the substrate at or near a leading edge of the substrate. The etching solution dispensed on the substrate can be any suitable liquid or solution or combination of liquids or solutions dispersed sequentially or simultaneously, to accomplish the desired etching, removal, or treatment of material. While FIG. 4C shows the etching solution dispensed manually, or by hand, by being poured from a beaker, in the case of production, the etching solution can be dispensed automatically or as part of an automated process, such as through one or more of a stream, spray, nozzle, or supply line. By dispensing the etching solution directly onto the substrate, rather than immersing the substrate into a bath of etching solution, significantly less etching solution can be required. Bath recirculation, filtering and maintenance can also eliminated through the single-use pool solution. The reduction in etching solution means that less chemical is used, less chemical is thrown away or disposed of after use, which can produce significant savings in material, maintenance, and operation cost.

Figure 4D:
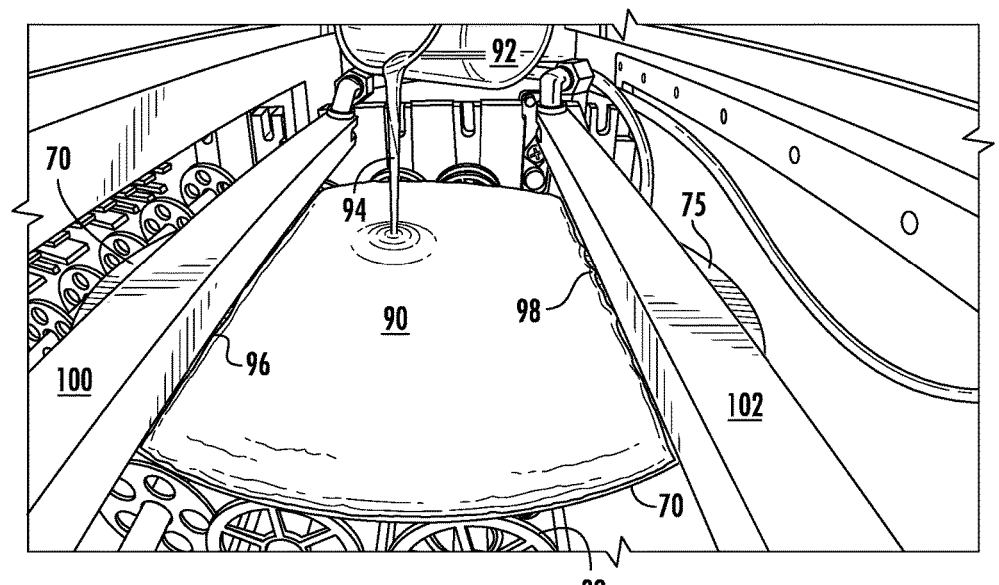

FIG. 4D shows a non-limiting example of two air-knife generators, shown as the elongated rectangular boxes at the left and right sides of FIG. 4D, being disposed over the substrate. The one or more air-knives can be used for manipulating or controlling the etching solution on the top surface of the substrate. The air-knife generators can be devices that provide air-knives or bands of air, such as pressurized or compressed air (which is optionally heated or cooled) that blows or is contained within specific limits or within desired areas.

In some instances, such as that shown in FIG. 4D, the air-knives can be thin and long, similar in shape to a knife blade. The air-knives allow containment of the etching solution, such as in the direction of the movement of the substrate. The air-knives can also provide a sufficient flow of air to agitate the etching solution that is largely contained in a direction perpendicular to the direction of movement on the substrate through surface tension of the etching solution. For ease of description, the first air-knife to pass over the substrate, e.g. the air-knife shown on the left of the FIG. 4D, is referred to as the first air-knife. Similarly, the second air-knife is the second air-knife to pass over the substrate, e.g., the air-knife shown on the right of FIG. 4D. The first air-knife establishes a point or line on the left side of the substrate beyond which the etching solution will not pass as the substrate passes along the conveyor. The second air-knife also contains the etching solution on the right side of the substrate, such as when the substrate is under both the first and the second air-knives. An amount or volume of etching solution to be place on the substrate can depend on the size of the substrate, the spacing of the air knives, and the surface tension of the etching solution.

Figure 4E:
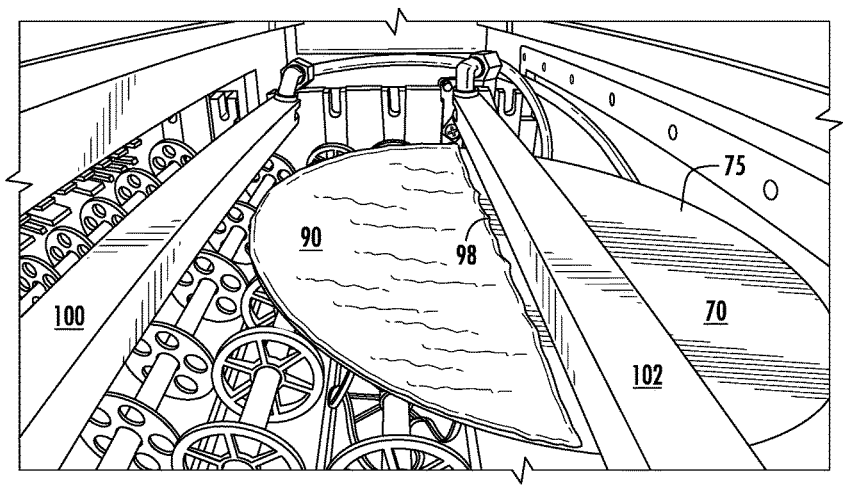

FIG. 4E shows that the first and second air knives, in addition to controlling and moving the etching material across the surface of the substrate, also provide an additional benefit of agitating the etching solution, as is shown by the choppy surface of the etching solution. Agitation of the etching solution provides a number of benefits. First, the agitation can cause the etching solution to spread and be evenly distributed across the substrate. Second the agitation can cause circulation or movement of the etching solution across the surface to be etched providing constant localized replenishment of the active chemical in contact with the material to be etched, such as a conductive seed layer to be removed. Agitation and localized replenishment of the etching solution can increase a rate of etching the material to be removed, and as such can reduce an amount of time of required to perform the etching, thus improving processing efficiency and reducing cost.

Figure 4F:
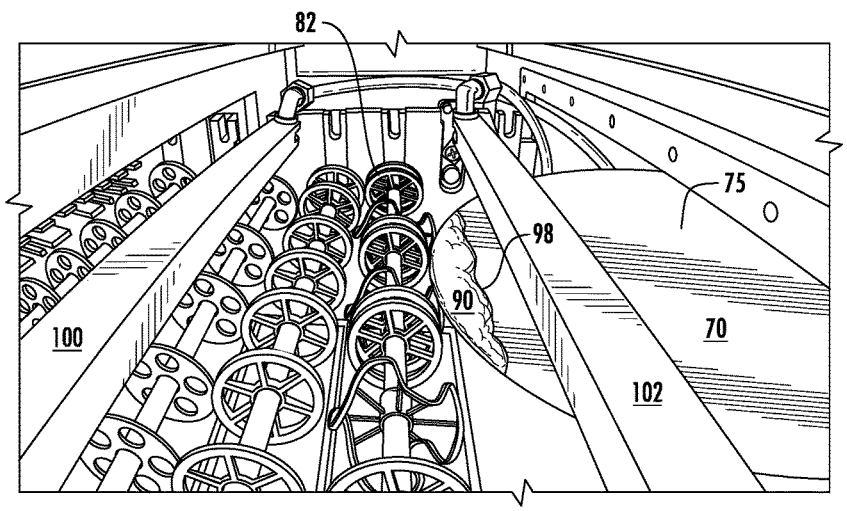

FIGS. 4E and 4F also show that once the substrate is no longer under the first air-knife, the second air-knife can operate as an etchant-removing or pool-removing knife to remove the etching solution from the substrate, including off the trailing edge shown at the left side of the FIGs. until all or substantially all of the etching-solution is removed from the substrate.

FIG. 4F also shows the last of the substrate moving under or through the second air-knife such that a final portion of the etching solution or pool is removed from the substrate. The etching solution removed from the substrate can be captured in a tank, basin, or catchment, such as below the conveyer, and can be reused or disposed of FIG. 4E also shows the color of the upper surface of the substrate can change as a result of the etching process, such as from copper to black.

While this disclosure includes a number of embodiments in different forms, there is presented in the drawings and written descriptions in the following pages detail of particular embodiments with the understanding that the present disclosure is to be considered as an exemplification of the principles of the disclosed methods and systems, and is not intended to limit the broad aspect of the disclosed concepts to the embodiments illustrated. Additionally, it should be understood by those of ordinary skill in the art that other structures, manufacturing devices, and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art. As such, it will be evident that various modifications and changes may be made thereto without departing from the broader spirit and scope of the inventions as set forth in the appended claims. The specification and drawings are, accordingly, to be regarded in an illustrative sense rather than a restrictive sense.

What is claimed is:

1. A method of removing material from a semiconductor device, comprising:
    providing a semiconductor substrate comprising a length L, a first surface, and a second surface opposite the first surface;
    forming a layer of material over the first surface of the semiconductor substrate;
    providing a conveyor;
    providing a first air-knife disposed over the conveyor;
    providing a second air-knife disposed over the conveyor and offset from the first air-knife by a distance D that is less than the length L of the semiconductor substrate;
    placing the semiconductor substrate on the conveyor with the layer of material oriented facing away from the conveyor, the semiconductor substrate being placed on the conveyor before the first air-knife and before the second air-knife;
    advancing the semiconductor substrate along the conveyor and under the first air-knife so that a portion of the semiconductor substrate is disposed between the first air-knife and the second air-knife;
    forming a pool of etching solution by dispensing an etching solution onto the layer of material over the portion of the semiconductor substrate disposed between the first air-knife and the second air-knife;
    etching a portion of the layer of material disposed between the first air-knife and the second air-knife with the pool of etching solution; and
    removing the pool of etching solution and at least a portion of the layer of material etched by the pool of etching solution from the surface of the semiconductor substrate by moving the semiconductor substrate along the conveyor and past the second air-knife.

2. The method of claim 1, wherein the semiconductor substrate comprises a native semiconductor wafer, a reconstituted semiconductor wafer, a panel, a fan-out wafer or panel, an embedded die panel, a chip carrier substrate, a printed circuit board (PCB), or a printed wiring panel.

3. The method of claim 1, wherein the first and second air knives are formed of airflows comprising widths of 1-20 mm and lengths greater than 200 mm in which the airflow moves at a speed greater than or equal to 0.1 meters per second.

4. The method of claim 1, wherein the pool of etching solution moves across the semiconductor substrate at a rate in a range of 50-100 millimeters per minute to provide the layer of material adequate time and exposure with the pool of etching solution to be completely removed in 15-300 seconds.

5. The method of claim 1, wherein the first air-knife and the second air-knife agitate the pool of etching solution on the layer of material to be removed to improve etching.

6. A method of removing at least a portion of a layer of material from over a semiconductor substrate, comprising:
    dispensing an etching solution over the semiconductor substrate to form a pool of etching solution on the at least a portion of the layer of material over the semiconductor substrate, wherein a footprint of the pool of etching solution is less than a footprint of the semiconductor substrate;
    moving at least one of the pool of etching solution with respect to the semiconductor substrate or the semiconductor substrate with respect to the pool of etching solution;
    defining a pool boundary of the pool of etching solution on the semiconductor substrate with at least one air-knife such that the pool of etching solution etches the layer of material over the semiconductor substrate within the footprint of the pool of etching solution; and
    removing the etching solution and the at least a portion of the layer of material etched by the etching solution with the at least one air-knife.

7. The method of claim 6, wherein the semiconductor substrate comprises a native semiconductor wafer, a reconstituted semiconductor wafer, a panel, a fan-out wafer or panel, an embedded die panel, a chip carrier substrate, a printed circuit board (PCB), or a printed wiring panel.

8. The method of claim 6, wherein moving at least one of the pool of etching solution with respect to the semiconductor substrate or the semiconductor substrate with respect to the pool of etching solution further comprises placing the semiconductor substrate on a conveyor that moves the semiconductor substrate with respect to a fixed position of the at least one air-knife.

9. The method of claim 6, wherein moving at least one of the pool of etching solution with respect to the semiconductor substrate or the semiconductor substrate with respect to the pool of etching solution further comprises moving the at least one air-knife with respect to a fixed position of the semiconductor substrate.

10. The method of claim 6, wherein moving at least one of the pool of etching solution with respect to the semiconductor substrate or the semiconductor substrate with respect to the pool of etching solution further comprises moving the at least one air-knife in a first direction and moving the semiconductor substrate in a second direction substantially opposing the first direction.

11. The method of claim 8, wherein containing the etching solution on the semiconductor substrate is done by a first air-knife and a second air-knife offset from the first air-knife.

12. The method of claim 9, wherein the first and second air knives are formed of airflows comprising widths of 1-20 mm and lengths greater than 200 mm in which the airflow moves at a speed greater than or equal to 0.1 meters per second.

13. The method of claim 10, wherein the etching solution and the at least a portion of the layer of material etched by the etching solution are removed by the second air-knife.

14. A method of removing at least a portion of a layer of material from over a semiconductor substrate, comprising:
providing a first air-knife;
providing a second air-knife offset from the first air-knife, the offset defining an etching area between the first air-knife and the second air-knife;
moving at least one of the semiconductor substrate, the first air-knife, or the second air-knife so that the semiconductor substrate passes through the etching area;
dispensing an etching solution onto the at least a portion of a layer of material over the semiconductor substrate in the etching area to form a pool of etching solution;
etching the at least a portion of the layer of material within the etching area with the pool of etching solution; and
removing the pool of etching solution and the at least a portion of the layer of material etched by the etching solution from the semiconductor substrate.

15. The method of claim 14, wherein the semiconductor substrate comprises a native semiconductor wafer, a reconstituted semiconductor wafer, a panel, a fan-out wafer or panel, an embedded die panel, a chip carrier substrate, a printed circuit board (PCB), or a printed wiring panel.

16. The method of claim 14, wherein moving at least one of the pool of etching solution with respect to the semiconductor substrate or the semiconductor substrate with respect to the pool of etching solution further comprises placing the semiconductor substrate on a conveyor that moves the semiconductor substrate with respect to a fixed position of the at least one air-knife.

17. The method of claim 14, wherein moving at least one of the pool of etching solution with respect to the semiconductor substrate or the semiconductor substrate with respect to the pool of etching solution further comprises moving the at least one air-knife with respect to a fixed position of the semiconductor substrate.

18. The method of claim 14, wherein moving at least one of the pool of etching solution with respect to the semiconductor substrate or the semiconductor substrate with respect to the pool of etching solution further comprises moving the at least one air-knife in a first direction and moving the semiconductor substrate in a second direction substantially opposing the first direction.

19. The method of claim 14, wherein the first and second air knives are formed of airflows comprising widths of 1-20 mm and lengths greater than 200 mm in which the airflow moves at a speed greater than or equal to 0.1 meters per second.

20. The method of claim 14, further comprising:
containing the pool of etching solution on the semiconductor substrate with the first air-knife and the second air-knife; and
removing the pool of etching solution and the at least a portion of the layer of material etched by the second air-knife.

* * * * *